United States Patent [19]

Raven

[11] Patent Number: 5,023,569

[45] Date of Patent: Jun. 11, 1991

[54] VARIABLE GAIN AMPLIFIER
[75] Inventor: Gregory S. Raven, Ft. Worth, Tex.
[73] Assignee: Motorola, Inc., Schaumburg, Ill.
[21] Appl. No.: 373,113
[22] Filed: Jun. 29, 1989
[51] Int. Cl.$^5$ .............................................. H03G 3/10
[52] U.S. Cl. ..................................... 330/285; 330/302
[58] Field of Search ............... 330/129, 131, 278, 279, 330/285, 296, 302

[56] References Cited
U.S. PATENT DOCUMENTS

| | | | |
|---|---|---|---|
| 3,714,601 | 1/1973 | Minton et al. | 330/285 X |
| 4,019,160 | 4/1977 | Kan | 330/302 X |
| 4,037,167 | 7/1977 | Hastings | 330/302 X |
| 4,243,947 | 1/1981 | Glennon | 330/285 X |
| 4,498,056 | 2/1985 | Kwitkowski et al. | 330/296 |

Primary Examiner—Steven Mottola
Attorney, Agent, or Firm—Juliana Agon

[57] ABSTRACT

An amplification device (18) has its gain controlled by varying the current flowing into the amplification device. The current is varied (36) by a means of a variable bias network that adapts the input current in response to a control signal. In this way, the amplification device is provided with variable gain while avoiding parametric regeneration.

7 Claims, 1 Drawing Sheet

VARIABLE GAIN AMPLIFIER

TECHNICAL FIELD

This invention relates generally to amplifiers, and more particularly to those amplifiers capable of varying their gain in response to a control signal.

BACKGROUND

Typical variable gain amplifiers commonly operate by varying a voltage potential coupled to the collector of a transistor amplification device. However, depending upon the type of amplification device chosen, the application of very low collector voltages to control the gain of the device may cause the occurrence of parametric regeneration, wherein the device begins to oscillate. Such condition is significantly detrimental to the performance of the amplifier and designers of amplification circuits strive to avoid or reduce the probability of such occurence whenever possible. Accordingly, a need exists for variable gain amplifier that avoids the parametric regeneration phenomena.

SUMMARY OF THE INVENTION

Accordingly, it is an object of the present invention to provide a variable gain amplifier that avoids the detriments of the prior art.

Briefly, according to the invention, an application device has its gain controlled by varying the current flowing into the amplification device. The current is varied by a means of a variable bias network that adapts the input current in response to a control signal. In this way, the application is provided with variable gain while avoiding the parametric regeneration condition.

DETAILED DESCRIPTION OF THE PREFERRED EMBODIMENT

Figure 1:
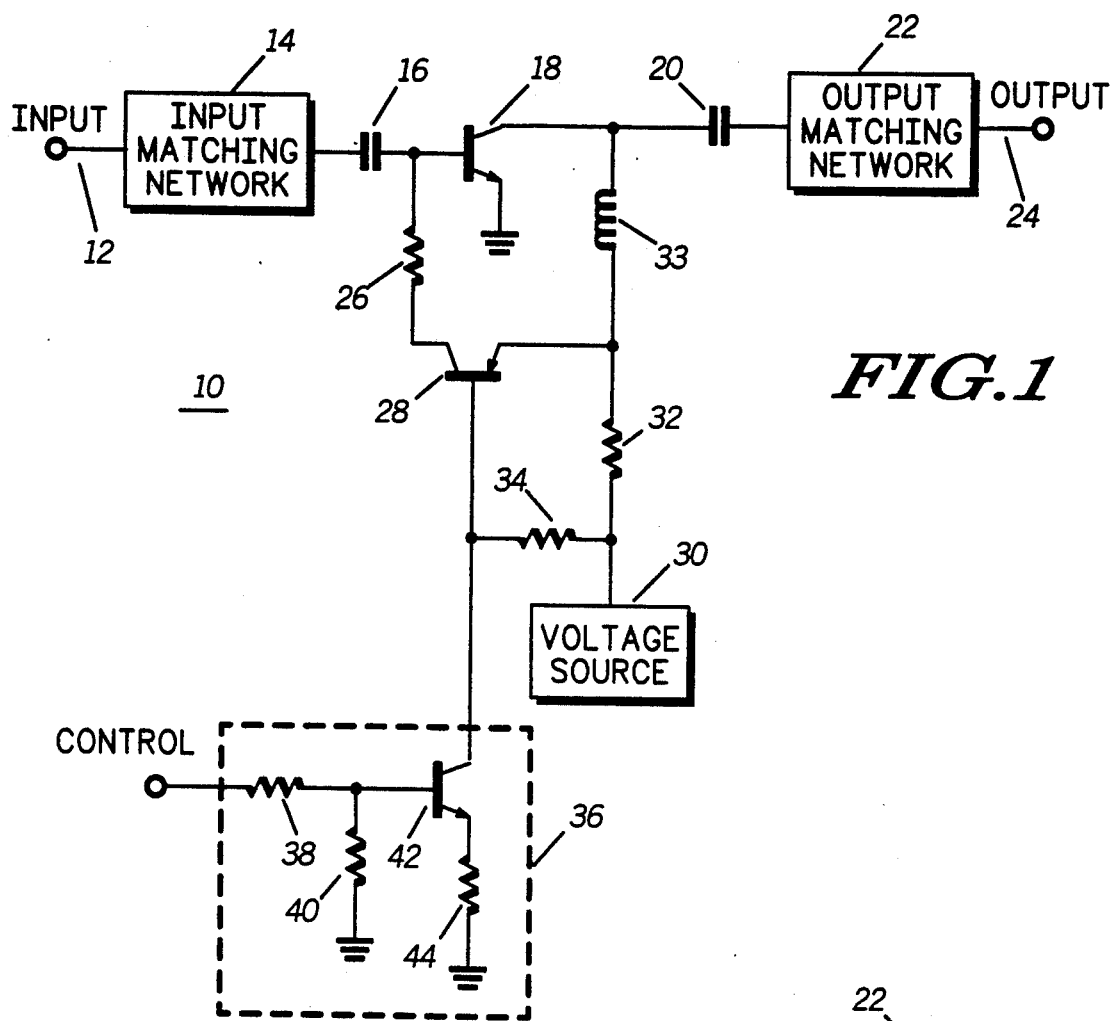
FIG. 1 is a schematic diagram of a variable gain amplifier in accordance with the present invention.

FIG. 1 schematically illustrates a variable gain amplifier 10 in accordance with the present invention. Operationally, a signal to be amplified is received by an input port 12 and presented to an input matching network 14, the purpose and design of which are well known in the art. Following the matching network 14, the signal flows through a DC blocking capacitor 16 into an amplification device 18, which preferably comprises an MRF 8372 manufactured by Motorola, Inc., or its functional equivalent. Schematically, the amplification device appears as a transistor amplifier 18 arranged in the common emitter mode. Accordingly, the input signal is received on the base and the output signal taken from the collector of the amplification device via another DC blocking capacitor 20. An output matching network 22 (also designed in a conventional manner) provides the amplified signal at an output port 24.

According to the invention, the gain of the amplification device 18 is controlled by varying the current flowing into the amplification device 18 from a biasing network. The magnitude of the current is set by a voltage source 30 and three resistors 32, 34 and 36, wherein at least one of the resistors (36 in this example) is a voltage variable resistor (i.e., its resistance changes in response to a control voltage). By varying the control voltage (and hence the resistance of the resistor 36), the current may be varied and set to any level desired. This level is maintained by the operation of a transistor 28 and resistor 26, which forms a feedback network about the amplification device 18 to maintain the current constant at whatever level it is set to by the variable control signal. Preferably, the control voltage resides in a range from 4 to 10 volts DC (although other voltage ranges could be used), which is divided by a resistor divider 38 and 40; the divided voltage being presented at the base of a transistor 42. By varying the base voltage of the transistor 42, the transistor 42 becomes a voltage variable resistor, which resistance is added in series to a resistor 44 to provide the total of all resistance of the voltage variable resistor 36. Thus, by varying the control voltage within the control voltage range, a resistance value for the resistor 36 is set that determines the current for the amplifier 18, which current is provided via an RF choke 33 to the collector.

Once a current magnitude has been determined by the control voltage, that current level is maintained constant by operation of the remaining portions of the biasing network. Since the voltage source 30 provides a constant voltage output, the voltage at the base of the transistor 28 will also remain constant since it is set by the voltage division of the resistors 34 and 36. If the collector current begins to increase, the voltage at the emitter of the transistor 28 will begin to fall. This decreases the base emitter voltage drop, which tends to shut off the PNP transistor 28. As the transistor 28 begins to shut off, its collector current begins to fall, which is used to supply the base current to the transistor 18 via the resistor 26. The falling base current of the transistor 18 tends to decrease the collector current, thus offsetting the attempted rise in collector current that triggered the adjustment. Conversely, a decreasing collector current tends to force the transistor 28 into a more active mode, increasing the current through the resistor 26 and into the base of the amplifier 18. This tends to increase the collector current, which offsets the initial drop that triggered the adjustment. In this way, the collector current is maintained at whatever level it is set at via the control voltage.

In the arrangement of FIG. 1, the control voltage and the current relationship is set in a positive relationship. That is, increasing control voltage tends to increase the collector current and hence the gain of the amplifier 18. An increasing control voltage tends to turn the transistor 42 into a more active mode which decreases its resistance. The decreased overall resistance of the resistor 36 causes the transistor 28 to become more active, sending an increasing current through the resistor 26 and into the base of the amplifier 18. This increases the collector current and hence the gain of the amplifier 18.

Figure 2:
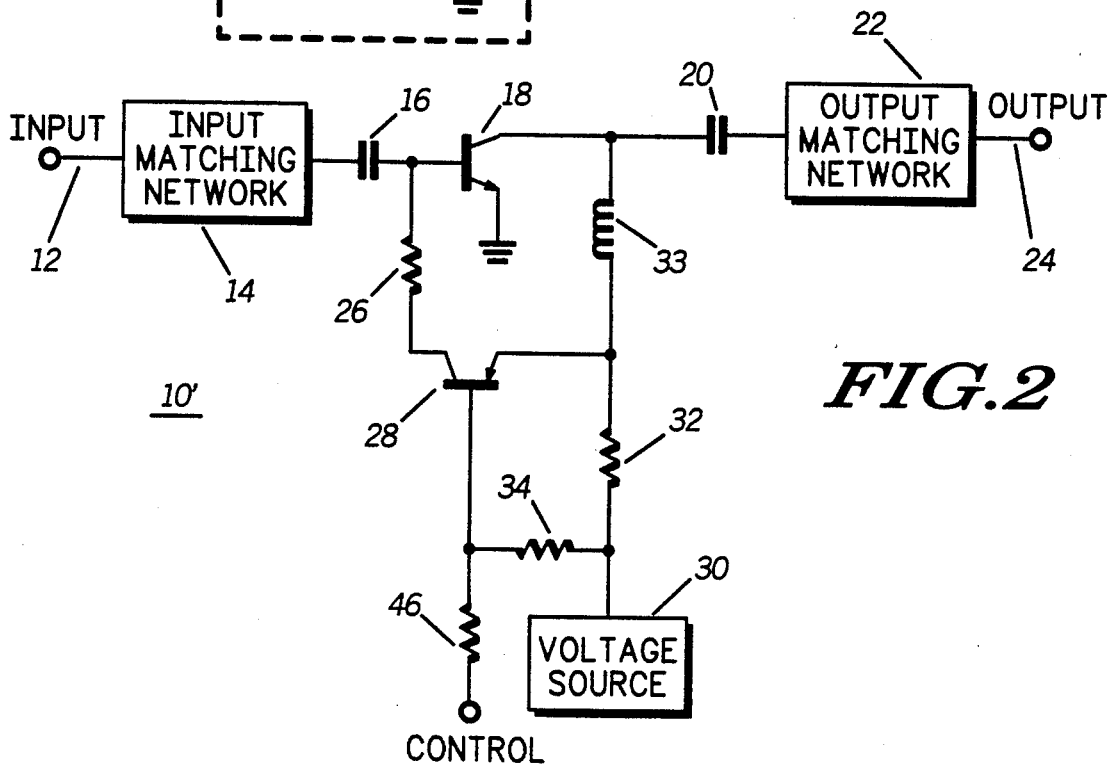
FIG. 2 is a schematic diagram of an alternative variable gain amplifier in accordance with the present invention.

Referring to FIG. 2, an alternate embodiment of the invention is shown having a negative relationship between the control voltage and the amplifier gain. That is, the amplifier 10' of FIG. 2 operates so that with increasing control voltage, the gain of the amplifier is decreased. Operationally, the control voltage causes the voltage at the base of the transistor 28 to rise over that value that it would otherwise be biased to in the absence of the control voltage. The increase base voltage cuts back on the operation of the amplifier 28, and reduces the current into the base of the amplifier 18 via the resistor 26. This reduced current operates to reduce the current and hence the gain of the amplifier 18. Of course, once the device current has been established, the circuit of FIG. 2 operates as described in conjunction with FIG. 1 to maintain that current constant avoiding fluctuation in the collector current.

What is claimed is:

1. An amplifier, comprising:
   means for variably amplifying an input signal in response to a variable bias current;
   bias means for providing the variable bias current to a bipolar transistor in response to a control signal; and
   feedback means for maintaining the variable bias current at a substantially constant level after the level has been determined by the control signal.

2. The amplifier of claim 1, wherein said bias means comprises a resistor network having at least one resistor capable of varying its resistance in response to the control signal.

3. The amplifier of claim 1, which includes input matching means for impedance matching an input port of the amplifier.

4. The amplifier of claim 1, which includes output matching means for impedance matching an output port of the amplifier.

5. The amplifier of claim 1, wherein said feedback means comprises a transistor and a resistor.

6. A method for controlling the gain of an amplifier, comprising the steps of:
   (a) varying a bias current to a control signal;
   (b) providing the variable bias current to a bipolar transistor so as to vary the gain thereof; and
   (c) maintaining the variable bias current at substantially the same level after the level is established by the control signal via a feedback network for offsetting a change in said level after said level is established.

7. An amplifier, comprising:
   a transistor amplifier having a base, collector, and emitter, said emitter being connected to ground for variably amplifying an input signal applied to said base in response to a variable bias current applied to said collector;
   a resistor network for providing said variable bias current having at least one resistor capable of varying its resistance in response to a control signal: and
   a feedback network coupled between said resistor network and said base for maintaining said variable bias current at a substantially constant level after a level has been determined by said control signal.

* * * * *

UNITED STATES PATENT AND TRADEMARK OFFICE
CERTIFICATE OF CORRECTION

PATENT NO. : 5,023,569
DATED : 06/11/91
INVENTOR(S) : Raven, Gregory S.

It is certified that error appears in the above-identified patent and that said Letters Patent is hereby corrected as shown below:

Column 4, line 5, after "current" insert -- in response --.

Signed and Sealed this

Sixteenth Day of March, 1993

Attest:

STEPHEN G. KUNIN

*Attesting Officer*    Acting Commissioner of Patents and Trademarks